(12) United States Patent
Zheng et al.

(10) Patent No.: US 8,681,539 B2
(45) Date of Patent: *Mar. 25, 2014

(54) STRAM WITH COMPOSITE FREE MAGNETIC ELEMENT

(71) Applicant: Seagate Technology LLC, Cupertino, CA (US)

(72) Inventors: Yuankai Zheng, Bloomington, MN (US); Dimitar V. Dimitrov, Edina, MN (US); Dexin Wang, Eden Prairie, MN (US); Haiwen Xi, Prior Lake, MN (US); Kaizhong Gao, Eden Prairie, MN (US); Olle Heinonen, Eden Prairie, MN (US); Wenzhong Zhu, Apple Valley, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/862,611

(22) Filed: Apr. 15, 2013

(65) Prior Publication Data

US 2013/0229862 A1    Sep. 5, 2013

Related U.S. Application Data

(63) Continuation of application No. 13/278,247, filed on Oct. 21, 2011, now Pat. No. 8,422,279, which is a continuation of application No. 12/396,868, filed on Mar. 3, 2009, now Pat. No. 8,045,366.

(60) Provisional application No. 61/111,351, filed on Nov. 5, 2008.

(51) Int. Cl.
*G11C 11/00* (2006.01)

(52) U.S. Cl.
USPC .................. 365/158; 365/171; 365/225.5

(58) Field of Classification Search
USPC ........................ 365/158, 171, 222.5
See application file for complete search history.

(56) References Cited

U.S. PATENT DOCUMENTS

| | | | |
|---|---|---|---|
| 4,733,371 | A | 3/1988 | Terada |
| 5,191,223 | A | 3/1993 | Munekata |
| 5,646,419 | A | 7/1997 | McCaldin |

(Continued)

FOREIGN PATENT DOCUMENTS

| | | |
|---|---|---|
| GB | 2 422 735 | 8/2006 |
| WO | WO 2008/100868 | 8/2008 |

OTHER PUBLICATIONS

U.S. Appl. No. 12/396,905, filed Mar. 3, 2009, Gao.
Baek et al., Tech. Dig. IEDM (2004) 587.

(Continued)

*Primary Examiner* — Connie Yoha
(74) *Attorney, Agent, or Firm* — Mueting Raasch & Gebhardt PA (57) ABSTRACT

Spin-transfer torque memory includes a composite free magnetic element, a reference magnetic element having a magnetization orientation that is pinned in a reference direction, and an electrically insulating and non-magnetic tunneling barrier layer separating the composite free magnetic element from the magnetic reference element. The free magnetic element includes a hard magnetic layer exchanged coupled to a soft magnetic layer. The composite free magnetic element has a magnetization orientation that can change direction due to spin-torque transfer when a write current passes through the spin-transfer torque memory unit.

19 Claims, 5 Drawing Sheets

(56) References Cited

U.S. PATENT DOCUMENTS

| | | |
|---|---|---|
| 5,673,225 A | 9/1997 | Jeong |
| 5,761,115 A | 6/1998 | Kozicki |
| 5,920,446 A | 7/1999 | Gill |
| 5,982,670 A | 11/1999 | Yamashita |
| 6,072,718 A | 6/2000 | Abraham |
| 6,178,136 B1 | 1/2001 | Lin |
| 6,226,197 B1 | 5/2001 | Nishimura |
| 6,252,796 B1 | 6/2001 | Lenssen |
| 6,381,106 B1 | 4/2002 | Pinarbasi |
| 6,469,926 B1 | 10/2002 | Chen |
| 6,532,164 B2 | 3/2003 | Redon |
| 6,542,000 B1 | 4/2003 | Black |
| 6,569,745 B2 | 5/2003 | Hsu |
| 6,584,016 B2 | 6/2003 | Park |
| 6,602,677 B1 | 8/2003 | Wood |
| 6,633,498 B1 | 10/2003 | Engel |
| 6,639,830 B1 | 10/2003 | Heide |
| 6,643,168 B2 | 11/2003 | Okazawa |
| 6,700,753 B2 | 3/2004 | Singleton |
| 6,703,645 B2 | 3/2004 | Ohno |
| 6,711,051 B1 | 3/2004 | Poplevine |
| 6,711,067 B1 | 3/2004 | Kablanian |
| 6,741,492 B2 | 5/2004 | Nii |
| 6,744,086 B2 | 6/2004 | Daughton |
| 6,759,263 B2 | 7/2004 | Ying |
| 6,765,819 B1 | 7/2004 | Bhattacharyya |
| 6,774,391 B1 | 8/2004 | Cowburn |
| 6,781,867 B2 | 8/2004 | Kurth |
| 6,781,871 B2 | 8/2004 | Park |
| 6,801,415 B2 | 10/2004 | Slaughter |
| 6,818,961 B1 | 11/2004 | Rizzo |
| 6,831,312 B2 | 12/2004 | Slaughter |
| 6,834,005 B1 | 12/2004 | Parkin |
| 6,835,423 B2 | 12/2004 | Chen |
| 6,842,317 B2 | 1/2005 | Sugita |
| 6,842,368 B2 | 1/2005 | Hayakawa |
| 6,845,038 B1 | 1/2005 | Shukh |
| 6,850,433 B2 | 2/2005 | Sharma |
| 6,864,551 B2 | 3/2005 | Tsang |
| 6,888,709 B2 | 5/2005 | Princinsky |
| 6,909,633 B2 | 6/2005 | Tsang |
| 6,914,807 B2 | 7/2005 | Nakamura |
| 6,920,063 B2 | 7/2005 | Huai |
| 6,930,910 B2 | 8/2005 | Oh |
| 6,943,040 B2 | 9/2005 | Min |
| 6,950,335 B2 | 9/2005 | Dieny |
| 6,963,500 B2 | 11/2005 | Tsang |
| 6,965,522 B2 | 11/2005 | Lung |
| 6,979,586 B2 | 12/2005 | Guo |
| 6,985,378 B2 | 1/2006 | Kozicki |
| 6,992,359 B2 | 1/2006 | Nguyen |
| 6,998,150 B2 | 2/2006 | Li |
| 7,009,877 B1 | 3/2006 | Huai |
| 7,020,024 B2 | 3/2006 | Sim |
| 7,067,330 B2 | 6/2006 | Min |
| 7,067,866 B2 | 6/2006 | Shi |
| 7,088,624 B2 | 8/2006 | Daniel |
| 7,092,279 B1 | 8/2006 | Sheppard |
| 7,093,347 B2 | 8/2006 | Nowak |
| 7,098,494 B2 | 8/2006 | Pakala |
| 7,098,495 B2 | 8/2006 | Sun |
| 7,099,186 B1 | 8/2006 | Braun |
| 7,105,372 B2 | 9/2006 | Min |
| 7,110,284 B2 | 9/2006 | Hayakawa |
| 7,137,192 B2 | 11/2006 | Sakaguchi |
| 7,138,648 B2 | 11/2006 | Kneissel |
| 7,187,577 B1 | 3/2007 | Wang |
| 7,189,435 B2 | 3/2007 | Tuominen |
| 7,196,882 B2 | 3/2007 | Deak |
| 7,224,601 B2 | 5/2007 | Panchula |
| 7,230,265 B2 | 6/2007 | Kaiser |
| 7,241,632 B2 | 7/2007 | Yang |
| 7,242,045 B2 | 7/2007 | Nguyen |
| 7,272,034 B1 | 9/2007 | Chen |
| 7,272,035 B1 | 9/2007 | Chen |
| 7,274,057 B2 | 9/2007 | Worledge |
| 7,282,755 B2 | 10/2007 | Pakala |
| 7,285,836 B2 | 10/2007 | Ju |
| 7,286,395 B2 | 10/2007 | Chen |
| 7,289,356 B2 | 10/2007 | Diao |
| 7,345,912 B2 | 3/2008 | Luo |
| 7,379,280 B2 * | 5/2008 | Fukumoto et al. ......... 360/324.2 |
| 7,379,327 B2 | 5/2008 | Chen |
| 7,385,842 B2 | 6/2008 | Deak |
| 7,403,418 B2 | 7/2008 | Lin |
| 7,408,806 B2 | 8/2008 | Park |
| 7,411,815 B2 | 8/2008 | Gogl |
| 7,436,638 B1 | 10/2008 | Pan |
| 7,477,491 B2 | 1/2009 | Li |
| 7,480,173 B2 | 1/2009 | Guo |
| 7,485,503 B2 | 2/2009 | Brask |
| 7,495,867 B2 | 2/2009 | Sbiaa |
| 7,502,249 B1 | 3/2009 | Ding |
| 7,515,457 B2 | 4/2009 | Chen |
| 7,539,047 B2 | 5/2009 | Katti |
| 7,572,645 B2 | 8/2009 | Sun |
| 7,573,736 B2 | 8/2009 | Wang |
| 7,728,622 B2 | 6/2010 | Chua-Eoan |
| 7,764,537 B2 | 7/2010 | Jung |
| 7,781,080 B2 * | 8/2010 | Takenoiri et al. ............. 428/828 |
| 7,782,661 B2 | 8/2010 | Yang |
| 7,881,095 B2 | 2/2011 | Lu |
| 7,894,246 B2 | 2/2011 | Ueda |
| 7,935,435 B2 | 5/2011 | Gao |
| 2003/0011945 A1 | 1/2003 | Yuasa |
| 2003/0137864 A1 | 7/2003 | Holden |
| 2004/0008537 A1 | 1/2004 | Sharma |
| 2004/0084702 A1 | 5/2004 | Jeong |
| 2004/0090809 A1 | 5/2004 | Tran |
| 2004/0170055 A1 | 9/2004 | Albert |
| 2004/0179311 A1 | 9/2004 | Li |
| 2004/0197579 A1 | 10/2004 | Chen |
| 2004/0257721 A1 | 12/2004 | Furukawa |
| 2005/0048674 A1 | 3/2005 | Shi |
| 2005/0068684 A1 | 3/2005 | Gill |
| 2005/0117391 A1 | 6/2005 | Yoda |
| 2005/0139883 A1 | 6/2005 | Sharma |
| 2005/0150535 A1 | 7/2005 | Samavedam |
| 2005/0150537 A1 | 7/2005 | Ghoshal |
| 2005/0184839 A1 | 8/2005 | Nguyen |
| 2005/0185459 A1 | 8/2005 | Fukuzumi |
| 2005/0237787 A1 | 10/2005 | Huai |
| 2005/0254286 A1 | 11/2005 | Valet |
| 2005/0269612 A1 | 12/2005 | Torok |
| 2005/0275003 A1 | 12/2005 | Shinmura |
| 2005/0282379 A1 | 12/2005 | Saito |
| 2006/0049472 A1 | 3/2006 | Diao |
| 2006/0060832 A1 | 3/2006 | Symanczyk |
| 2006/0061919 A1 | 3/2006 | Li |
| 2006/0083047 A1 | 4/2006 | Fujita |
| 2006/0141640 A1 | 6/2006 | Huai |
| 2006/0171199 A1 | 8/2006 | Ju |
| 2006/0233017 A1 | 10/2006 | Hosotami |
| 2006/0245117 A1 | 11/2006 | Nowak |
| 2007/0002504 A1 | 1/2007 | Huai |
| 2007/0007609 A1 | 1/2007 | Saito |
| 2007/0008661 A1 | 1/2007 | Min |
| 2007/0025164 A1 | 2/2007 | Kim |
| 2007/0029630 A1 | 2/2007 | Seyyedy |
| 2007/0035890 A1 | 2/2007 | Sbiaa |
| 2007/0047294 A1 | 3/2007 | Panchula |
| 2007/0054450 A1 | 3/2007 | Hong |
| 2007/0063237 A1 | 3/2007 | Huai |
| 2007/0064352 A1 | 3/2007 | Gill |
| 2007/0069314 A1 | 3/2007 | Wilson |
| 2007/0085068 A1 | 4/2007 | Apalkov |
| 2007/0096229 A1 | 5/2007 | Yoshikawa |
| 2007/0097730 A1 | 5/2007 | Chen |
| 2007/0120210 A1 | 5/2007 | Yuan |
| 2007/0132049 A1 | 6/2007 | Stipe |
| 2007/0164380 A1 | 7/2007 | Min |
| 2007/0171694 A1 | 7/2007 | Huai |
| 2007/0230233 A1 | 10/2007 | Takahashi |
| 2007/0241392 A1 | 10/2007 | Lin |

(56) References Cited

U.S. PATENT DOCUMENTS

| | | |
|---|---|---|
| 2007/0246787 A1 | 10/2007 | Wang |
| 2007/0279968 A1 | 12/2007 | Luo |
| 2007/0297220 A1 | 12/2007 | Yoshikawa |
| 2007/0297223 A1 | 12/2007 | Chen |
| 2008/0026253 A1 | 1/2008 | Yuasa |
| 2008/0061388 A1 | 3/2008 | Diao |
| 2008/0130354 A1 | 6/2008 | Ho |
| 2008/0179699 A1 | 7/2008 | Horng |
| 2008/0180991 A1 | 7/2008 | Wang |
| 2008/0191251 A1 | 8/2008 | Ranjan |
| 2008/0205121 A1 | 8/2008 | Chen |
| 2008/0258247 A1 | 10/2008 | Mancoff |
| 2008/0265347 A1 | 10/2008 | Iwayama |
| 2008/0273380 A1 | 11/2008 | Diao |
| 2008/0277703 A1 | 11/2008 | Iwayama |
| 2008/0291721 A1 | 11/2008 | Apalkov |
| 2008/0310213 A1 | 12/2008 | Chen |
| 2009/0027810 A1 | 1/2009 | Horng |
| 2009/0040855 A1 | 2/2009 | Luo |
| 2009/0073756 A1 | 3/2009 | Yang |
| 2009/0185410 A1 | 7/2009 | Huai |
| 2009/0218645 A1 | 9/2009 | Ranjan |
| 2009/0257154 A1 | 10/2009 | Carey |
| 2009/0296454 A1 | 12/2009 | Honda |
| 2010/0034009 A1 | 2/2010 | Lu |
| 2010/0118600 A1 | 5/2010 | Nagasi |
| 2010/0176471 A1 | 7/2010 | Zhu |
| 2010/0177558 A1 | 7/2010 | Sakimura |
| 2011/0006385 A1 | 1/2011 | Zheng |

OTHER PUBLICATIONS

Berger, Emission of Spin Waves by Magnetic Multilayer Traversed by a Current, Physic. Review B 54, 9353 (1996).
Black et al., Programmable Logic Using Giant Magnetoresistance and Spin-Dependent Tunneling Devices (Invited), J. Appl. Phys. 87, 6674 (2000).
Chu et al., Fabrication of Ideally Ordered Nanoporous Alumina Films and Integrated Alumina Nanotubule Arrays by High-Field Anodization, Adv. Mater. 2005, 17, 2115-2119.
Cowburn et al., Room Temperature Magnetic Quantum Cellular Automata, Science 287, 1466 (2000).
de Groot et al., New Class of Materials: Half-Metallic Ferromagnets, Physics Review Letters, 50, 2024 (1983).
Egelhoff et al., Oxygen as a Surfactant in the Growth of Giant Magnetoresistance Spin Valves, Journal of Applied Physics 82 (12), Dec. 15, 1997.
Emley, N.C., et al., Reduction of Spin Transfer by Synthetic Antiferromagnets, Applied Physics Letters, May 24, 2004, pp. 4257-4259, vol. 84, No. 21.
Folk et al., A Gate-Controlled Bidirectional Spin Filter Using Quantum Coherence, Science, vol. 299, Jan. 31, 2003, pp. 679-682.
Hayakawa et al., Current-Induced Magnetization Switching in MgO Barrier Based Magnetic Tunnel Junctions with CoFeB/Ru/CoFeB Synthetic Ferrimagnetic Free layer, Japanese Journal of Applied Physics, vol. 45, No. 40, 2006, pp. L1057-L1060.
Huczko, Template-Based Synthesis of Nanomaterials, Appl. Phys. A 70, 365-376 (2000).
Kawahara et al., 2Mb Spin-Transfer Torque RAM (SPRAM) with Bit-by-Bit Bidirectional Current Write and Parallelizing-Direction Current Read, ISSCC 2007, Section 26, Non-Volatile Memories/26.5.
Korenivski, et al., Thermally Activiated Switching in Spin-Flop Tunnel Junctions, Applied Physics Letters 86, 252506 (2005).
Li et al., Role of Oxygen Exposure in Different Positions in the Synthetic Spin Valves, Journal of Applied Physics, vol. 93, No. 10, May 15, 2003.
Macak et al., High-Aspect-Ratio TiO2, Nanotubes by Anodization of Titanium, Angew. Chem. Int. Ed. 2005, 44, 2100-2102.
Masuda and Kenji Fukuda, Science, 268, 1466 91995).
Masuda et al., Ordered Metal Nanohole Arrays Made by a Two-Step Replication of Honeycomb Structures of Anodic Alumina, Science, Ol. 268, Jun. 9, 1995.
Meng et al., A Spintronics Full Adder for Magnetic CPU, IEEE Elec. Dev. Lett. 26, 360 (2005).
Miura et al., A Novel SPRAM (Spin Transfer Torque RAM) with a Synthetic Ferrimagnetic Free Layer . . . , VLSI Symposium on VLSI Tech. Digest of Technical Papers (2007).
Ney et al., Programmable Computing with a Single Magnetoresistance Element, Nature 425, 485 (2003).
PCT Search Report and Written Opinion dated Oct. 4, 2010.
PCT Search Report and Written Opinion dated Mar. 10, 2010.
PCT Search Report and Written Opinion dated Mar. 22, 2010.
Sharrock, Time Dependence of Switching Fields in Magnetic Recording Media (Invited), J. Appl. Phys. 76 (10), Nov. 15, 1994.
Sun, Current-Driven Magnetic Switching in Manganite Trilayer Junctions, Journal of Magnetism and Magnetic Materials 202 (1999) 157-162.
Thurn-Albrecht et al., Science, 290, 2126 (2000).
U.S. Appl. No. 12/416,976, filed Apr. 2, 2009, Inventor: Zheng.
U.S. Appl. No. 12/106,382, filed Apr. 21, 2008, Inventors: Xi et al.
U.S. Appl. No. 12/125,975, filed May 23, 2008, Inventor: Xi.
U.S. Appl. No. 12/126,014, filed May 23, 2008, Inventor: Xiaohua Lou.
U.S. Appl. No. 12/170,519, filed Jul. 10, 2008, Inventors: Xi et al.
U.S. Appl. No. 12/175,545, filed Jul. 18, 2008, Inventor: Lou.
U.S. Appl. No. 12/239,882, filed Sep. 29, 2008, Inventor: Zheng et al.
U.S. Appl. No. 12/239,887, filed Sep. 29, 2008; Inventor: Zheng.
U.S. Appl. No. 12/258,476, filed Oct. 27, 2008, Inventor: Lou.
U.S. Appl. No. 12/258,491, filed Oct. 27, 2008, Inventor: Lou.
U.S. Appl. No. 12/258,492, filed Oct. 27, 2008, Inventor: Lou.
U.S. Appl. No. 12/269,507, filed Nov. 12, 2008, Inventor: Tian.
U.S. Appl. No. 12/269,514, filed Nov. 12, 2008, Inventor: Venkatasamy.
U.S. Appl. No. 12/269,537, filed Nov. 12, 2008, Inventor: Tang et al.
U.S. Appl. No. 12/398,214, filed Mar. 5, 2009, Inventor: Wang et al.
U.S. Appl. No. 12/425,457, filed Apr. 17, 2009, Inventor: Gao.
Vurgaftman et al., Spin-Polarizing Properties of the InAs/(AlSb)/GaMnSb/(AlSb/InAs Ferromagnetic Resonant Interband Tunneling Diode, Physical Review B 67, 12509 (2003).
Wendt et al., Electronic and Vibrational Properties of Ultrathin SiO2 Films Grown on Mo(112), 2005, Phys. Rev. vol. B72, pp. 1150409-1-115409.0.
Yan et al., Magnesium Oxide as a Candidate High-k Gate Dielelectric, 2006, Applied Physics Lett. vol. 88, pp. 142901-1-142901-3.
Yen et al., Reduction in Critical Current Density for Spin Torque Transfer Switching with Composite Free Layer, Applied Physics Letters 93, 092504 (2008).
Zheng et al., Low Switching Current Flux-Closed Magnetoresistive Random Access Memory, Journal of Applied Physics, May 15, 2003.
Zhuang et al., Tech Dig. IEDM (2002) 193.
Meng et al., Spin Transfer in Nanomagnetic Devices with Perpendicular Anistropy, Applied Physics Letters 88, 172506 (2006).
Sek et al., Spin-Polarized Current-Induced Magnetization Reversal in Perpendicularly Magnetized L1o-FePt Layers, Applied Physics Letters 88, 172504 (2006).
Zheng et al., Magnetic Random Access Memory (MRAM), Journal of Nanoscience and Nanotechnology, vol. 7, 117-137 (2007).
I L. Prejbeanu et al., Thermally Assisted MRAM, Journal of Physics Condensed Matter 19 (2007) 165218 (23 pp).
Slonczewski et al., Current-Driven Excitation of Magnetic Multilayers, Journal of Magnetism and Magnetic Materials 159 (1996) L1-L7.
Sun, Spin-Current Interaction with Monodomain Magnetic Body: A Model Study, Physical Review B, vol. 62, No. 1, Jul. 2000.
Sun, J.Z., Spin Angular Momentum Transfer in Current-Perpendicular Nanomagnetic Junctions, IBM J. Res & Dev., vol. 50, No. 1, Jan. 2006, pp. 81-100.

\* cited by examiner

STRAM WITH COMPOSITE FREE MAGNETIC ELEMENT

CROSS-REFERENCE TO RELATED APPLICATIONS

This application is a continuation application of U.S. application Ser. No. 13/278,247, filed Oct. 21, 2011, which is now U.S. Pat. No. 8,422,279, which is a continuation of U.S. application Ser. No. 12/396,868, filed Mar. 3, 2009, which is now U.S. Pat. No. 8,045,366, which claims the benefit of U.S. Provisional Application No. 61/111,351 filed Nov. 5, 2008, the contents of both are hereby incorporated by reference in their entirety.

BACKGROUND

Fast growth of the pervasive computing and handheld/communication industry has generated exploding demand for high capacity nonvolatile solid-state data storage devices. Current technology like flash memory has several drawbacks such as slow access speed, limited endurance, and the integration difficulty. Flash memory (NAND or NOR) also faces significant scaling problems.

Resistive sense memories are promising candidates for future nonvolatile and universal memory by storing data bits as either a high or low resistance state. One such memory, MRAM, features non-volatility, fast writing/reading speed, almost unlimited programming endurance and zero standby power. The basic component of MRAM is a magnetic tunneling junction (MTJ). MRAM switches the MTJ resistance by using a current induced magnetic field to switch the magnetization of MTJ. As the MTJ size shrinks, the switching magnetic field amplitude increases and the switching variation becomes more severe.

A write mechanism, which is based upon spin polarization current induced magnetization switching, has been introduced to the MRAM design. Spin-Transfer Torque RAM (STRAM), uses a (bidirectional) current through the MTJ to realize the resistance switching. Therefore, the switching mechanism of STRAM is constrained locally and STRAM is believed to have a better scaling property than the conventional MRAM.

However, a number of yield-limiting factors must be overcome before STRAM enters the production stage. One concern in traditional STRAM design is the thickness tradeoff between of the free layer of the STRAM cell. A thicker free layer improves the thermal stability and data retention but also increases the switching current requirement since it is proportional to the thickness of the free layer. Thus, the amount of current required to switch the STRAM cell between resistance data states is large.

BRIEF SUMMARY

The present disclosure relates to a spin-transfer torque memory unit that includes a composite free magnetic element. In particular, the present disclosure relates to a spin-transfer torque memory unit that includes a free magnetic element having a hard magnetic layer exchanged coupled to a soft magnetic layer.

In one particular embodiment, a spin-transfer torque memory includes a composite free magnetic element, a reference magnetic element having a magnetization orientation that is pinned in a reference direction, and an electrically insulating and non-magnetic tunneling barrier layer separating the composite free magnetic element from the magnetic reference element. The free magnetic element includes a hard magnetic layer exchanged coupled to a soft magnetic layer. The composite free magnetic element has a magnetization orientation that can change direction due to spin-torque transfer when a write current passes through the spin-transfer torque memory unit.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to a spin-transfer torque memory (STRAM) that includes a composite free magnetic element. In particular, the present disclosure relates to a spin-transfer torque memory unit that includes a free magnetic element having a hard magnetic layer exchanged coupled to a soft magnetic layer. The hard magnetic layer can be a continuous magnetic layer or a non-continuous magnetic layer. The non-continuous hard magnetic layer can be a plurality of hard magnetic particles in a matrix of non-magnetic material. The composite free magnetic element has a reduced in-plane anisotropy, which leads to a large reduction in the switching current of the spin-transfer torque memory. The hard magnetic layer of the composite free magnetic element has a high intrinsic anisotropic energy and uniaxial magnetic anisotropy which allows the spin-transfer torque memory cells to scale down to 10 nanometers or below and is robust against shape variability. While the present disclosure is not so limited, an appreciation of various aspects of the disclosure will be gained through a discussion of the examples provided below.

Figure 1:
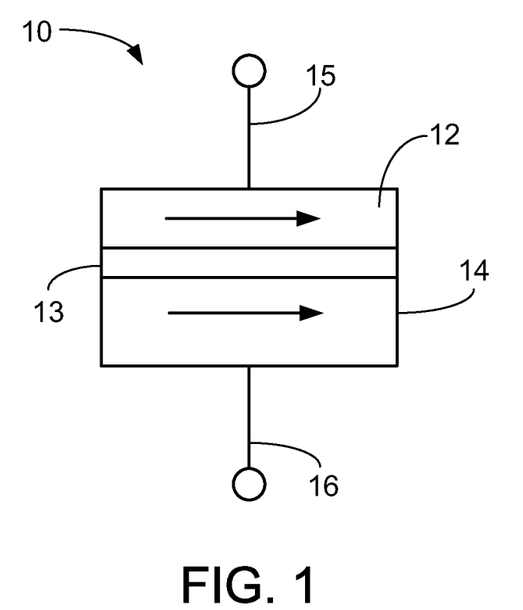
FIG. 1 is a cross-sectional schematic diagram of an illustrative magnetic tunneling junction (MTJ) in the low resistance state.
Figure 2:
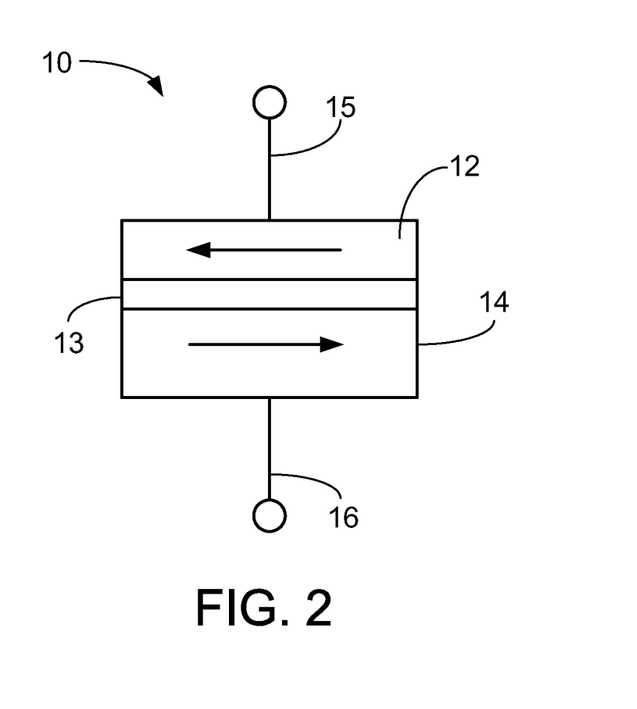
FIG. 2 is a cross-sectional schematic diagram of the illustrative MTJ in the high resistance state.

FIG. 1 is a cross-sectional schematic diagram of an illustrative magnetic tunneling junction (MTJ) cell 10 in the low resistance state and FIG. 2 is a cross-sectional schematic diagram of the illustrative MTJ cell 10 in the high resistance state. The MTJ cell can be any memory cell that can switch between a high resistance state and a low resistance state. In many embodiments, the MTJ cell described herein is a spin-transfer torque memory cell.

The MTJ cell 10 includes a ferromagnetic free layer 12 (i.e., free magnetic layer) and a ferromagnetic reference or pinned layer 14 (i.e., free magnetic layer). The ferromagnetic free layer 12 and a ferromagnetic reference layer 14 are separated by an oxide barrier layer 13 or tunneling barrier layer. A first electrode 15 is in electrical contact with the ferromagnetic free layer 12 and a second electrode 16 is in electrical contact with the ferromagnetic reference layer 14. The ferromagnetic layers 12, 14 may be made of any useful ferromagnetic (FM) alloys such as, for example, Fe, Co, Ni and the insulating tunneling barrier layer 13 may be made of an electrically insulating material such as, for example an oxide material (e.g., $Al_2O_3$ or MgO). Other suitable materials may also be used.

The electrodes 15, 16 electrically connect the ferromagnetic layers 12, 14 to a control circuit providing read and write currents through the ferromagnetic layers 12, 14. The resistance across the MTJ cell 10 is determined by the relative orientation of the magnetization vectors or magnetization orientations of the ferromagnetic layers 12, 14. The magnetization direction of the ferromagnetic reference layer 14 is pinned in a predetermined direction while the magnetization direction of the ferromagnetic free layer 12 is free to rotate under the influence of a spin torque. Pinning of the ferromagnetic reference layer 14 may be achieved through, e.g., the use of exchange bias with an antiferromagnetically ordered material such as PtMn, IrMn and others.

FIG. 1 illustrates the MTJ cell 10 in the low resistance state where the magnetization orientation of the ferromagnetic free layer 12 is parallel and in the same direction of the magnetization orientation of the ferromagnetic reference layer 14. This is termed the low resistance state or "0" data state. FIG. 2 illustrates the MTJ cell 10 in the high resistance state where the magnetization orientation of the ferromagnetic free layer 12 is anti-parallel and in the opposite direction of the magnetization orientation of the ferromagnetic reference layer 14. This is termed the high resistance state or "1" data state. Although the magnetization orientations are illustrated as being in-plane, it is understood that the magnetization orientations of the reference magnetic layer 14 can be perpendicular to the in-plane direction of the free magnetic layer 12 and the reference magnetic layer 14.

Switching the resistance state and hence the data state of the MTJ cell 10 via spin-transfer occurs when a current, passing through a magnetic layer of the MTJ cell 10, becomes spin polarized and imparts a spin torque on the free layer 12 of the MTJ cell 10. When a sufficient spin torque is applied to the free layer 12, the magnetization orientation of the free layer 12 can be switched between two opposite directions and accordingly the MTJ cell 10 can be switched between the parallel state (i.e., low resistance state or "0" data state) and anti-parallel state (i.e., high resistance state or "1" data state) depending on the direction of the current.

The illustrative spin-transfer torque MTJ cell 10 may be used to construct a memory device that includes multiple variable resistive memory cells where a data bit is stored in magnetic tunnel junction cell by changing the relative magnetization state of the free magnetic layer 12 with respect to the reference or pinned magnetic layer 14. The stored data bit can be read out by measuring the resistance of the cell which changes with the magnetization direction of the free layer relative to the pinned magnetic layer. In order for the spin-transfer torque MTJ cell 10 to have the characteristics of a non-volatile random access memory, the free layer exhibits thermal stability against random fluctuations so that the orientation of the free layer is changed only when it is controlled to make such a change.

Figure 3:
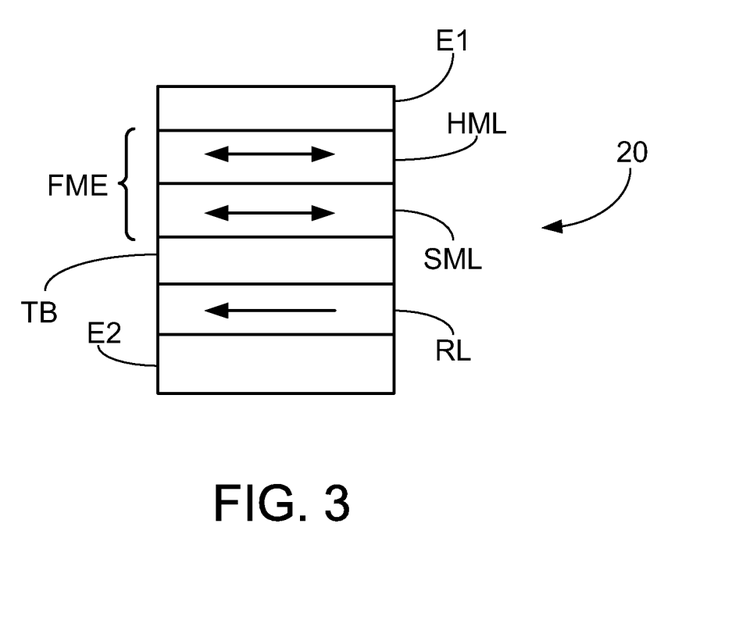
FIG. 3 is a side view schematic diagram of an illustrative spin-transfer torque memory unit with a composite free magnetic element.
Figure 4:
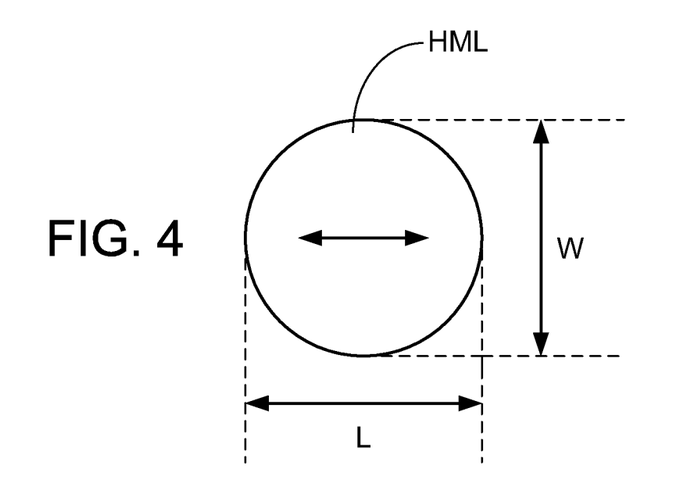
FIG. 4 is a top view schematic diagram of an illustrative composite free magnetic element of FIG. 3.

FIG. 3 is a side view schematic diagram of an illustrative spin-transfer torque memory unit 20 with a composite free magnetic element FME. FIG. 4 is a top view schematic diagram of an illustrative composite free magnetic element FME of FIG. 3. The composite free magnetic element FME and the spin-transfer torque memory unit 20 can have an aspect ratio (length L/width W) of approximately 1, as illustrated in FIG. 4. Thus, the composite free magnetic element FME and the spin-transfer torque memory unit 20 described herein can be scaled to a length L and a width W to 10 nanometers or less and can increase the spin-transfer torque memory 20 density when formed in an array.

The spin-transfer torque memory unit 20 includes a composite free magnetic element FME, a reference magnetic element or layer RL, and an electrically insulating and non-magnetic tunneling barrier layer TB separating the multilayer free magnetic layer FL from the reference magnetic layer RL. The reference magnetic layer RL can be a single ferromagnetic layer, or may include multiple layers, for example, a pair of ferromagnetically coupled ferromagnetic layers, an anti-ferromagnetic pinning layer and a ferromagnetic pinned layer, a synthetic antiferromagnetic, or a synthetic antiferromagnetic with an antiferromagnetic layer.

The composite free magnetic element FME includes a hard magnetic layer HML exchanged coupled to a soft magnetic layer SML. In many embodiments the hard magnetic layer HML is disposed on the soft magnetic layer SML. The composite free magnetic element FME has a magnetization orientation that can change direction due to spin-torque transfer when a write current passes through the spin-transfer torque memory unit 20 between the first electrode E1 and the second electrode E2.

The hard magnetic layer HML has uniaxial magnetic anisotropy and a low saturation magnetization. In many embodiments, the saturation magnetization of the hard magnetic layer HML is less than 1000 emu/cm$^3$, or less than 500 emu/cm$^3$, or in a range from 200 to 1000 emu/cm$^3$, or in a range from 250 to 750 emu/cm$^3$. In many embodiments, the hard magnetic layer HML has a coercivity value that is equal to or greater than 1000 Oersteds. The hard magnetic layer HML can be formed of any useful material having the above properties such as, alloys of Co, Ni, Fe, Cr, Dy, Sm, Pt, Pd, and the like. The hard magnetic layer HML can have any useful thickness such as from 20 to 100 Angstroms, or from 20 to 50 Angstroms.

The soft magnetic layer SML has a spin polarization value equal to or greater than 0.5. The soft magnetic layer SML can create a large spin polarization in the electrical current used to switch the spin-transfer torque memory unit 20. In many embodiments, the soft magnetic layer SML has a coercivity value that is equal to or less than 500 Oersteds. The soft magnetic layer SML can be formed of any useful ferromagnetic material having the above properties. The soft magnetic layer SML can have any useful thickness such as from 5 to 20 Angstroms.

Figure 5:
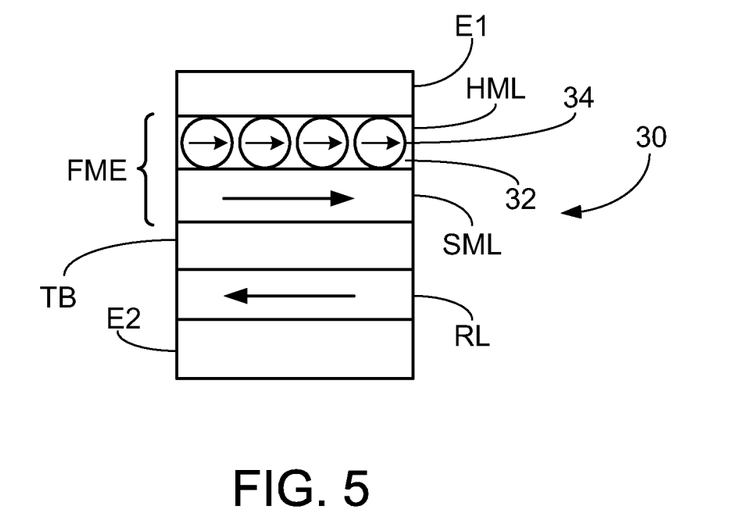
FIG. 5 is a side view schematic diagram of an illustrative spin-transfer torque memory unit with a composite free magnetic element that includes a granular hard magnetic layer.
Figure 6:
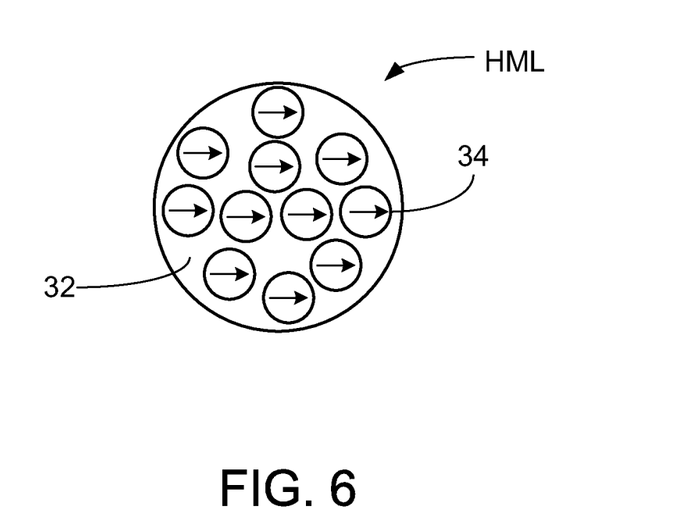
FIG. 6 is a top view schematic diagram of an illustrative granular hard magnetic layer of FIG. 5.

FIG. 5 is a side view schematic diagram of an illustrative spin-transfer torque memory unit 30 with a composite free magnetic element FME that includes a granular hard magnetic layer HML. FIG. 6 is a top view schematic diagram of an illustrative granular hard magnetic layer HML of FIG. 5.

The composite free magnetic element FME and the spin-transfer torque memory unit 30 can have an aspect ratio (length/width) of approximately 1, as illustrated as a circular shape in FIG. 6. Thus, the composite free magnetic element FME and the spin-transfer torque memory unit 30 described herein can be scaled to a length and a width to 10 nanometers or less and can increase the spin-transfer torque memory 30 density when formed in an array.

The spin-transfer torque memory unit 30 includes a composite free magnetic element FME, a reference magnetic element or layer RL, and an electrically insulating and non-magnetic tunneling barrier layer TB separating the multilayer free magnetic layer FL from the reference magnetic layer RL. The reference magnetic layer RL can be a single ferromagnetic layer, or may include multiple layers, for example, a pair of ferromagnetically coupled ferromagnetic layers, an antiferromagnetic pinning layer and a ferromagnetic pinned layer, a synthetic antiferromagnetic, or a synthetic antiferromagnetic with an antiferromagnetic layer.

The composite free magnetic element FME includes a granular hard magnetic layer HML exchanged coupled to a soft magnetic layer SML. In many embodiments the granular hard magnetic layer HML is disposed on the soft magnetic layer SML. The composite free magnetic element FME has a magnetization orientation that can change direction due to spin-torque transfer when a write current passes through the spin-transfer torque memory unit 30 between the first electrode E1 and the second electrode E2.

The granular hard magnetic layer HML is a non-continuous magnetic layer of hard magnetic clusters or particles that are separated by non-magnetic material. The granular hard magnetic layer HML includes a plurality of hard magnetic particles 34 that are in a matrix of non-magnetic material 32. In many embodiments, the matrix of non-magnetic material 32 is an electrically insulating material such as, SiO$_2$, HfO, AlO and the like. In some embodiments, the matrix of non-magnetic material 32 is an electrically conducting material such as, Cu, Ag, Au, Al and the like. The granular hard magnetic layer HML can be formed by co-sputtering the hard magnetic particles 34 with the non-magnetic material 32.

The hard magnetic particles 34 have uniaxial magnetic anisotropy and a low saturation magnetization. In many embodiments, the saturation magnetization of the hard magnetic particles 34 is less than 1000 emu/cm$^3$, or less than 500 emu/cm$^3$, or in a range from 200 to 1000 emu/cm$^3$, or in a range from 250 to 750 emu/cm$^3$. In many embodiments, the hard magnetic particles 34 have a coercivity value that is equal to or greater than 1000 Oersteds. The hard magnetic particles 34 can be formed of any useful material having the above properties such as, alloys of Co, Ni, Fe, Cr, Dy, Sm, Pt, Pd, and the like. The magnetic properties of the hard magnetic particles 34 establish the net magnetization properties of the hard magnetic layer HML. The hard magnetic layer HML can have any useful thickness such as from 20 to 100 Angstroms, or from 20 to 50 Angstroms.

The soft magnetic layer SML has a spin polarization value equal to or greater than 0.5. The soft magnetic layer SML can create a large spin polarization in the electrical current used to switch the spin-transfer torque memory unit 30. In many embodiments, the soft magnetic layer SML has a coercivity value that is equal to or less than 500 Oersteds. The soft magnetic layer SML can be formed of any useful ferromagnetic material having the above properties. The soft magnetic layer SML can have any useful thickness such as from 5 to 20 Angstroms.

Figure 7:
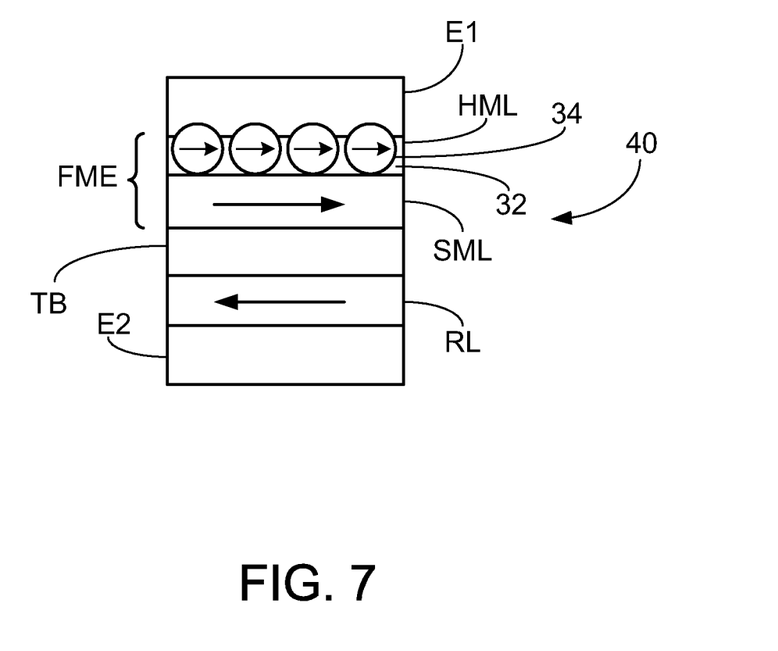
FIG. 7 is a side view schematic diagram of another illustrative spin-transfer torque memory unit with a composite free magnetic element that includes a granular hard magnetic layer.

FIG. 7 is a side view schematic diagram of another illustrative spin-transfer torque memory unit 40 with a composite free magnetic element FME that includes a granular hard magnetic layer HML. This embodiment is similar to that of FIGS. 5 and 6, except that the hard magnetic particles 34 are partially exposed above the matrix of non-magnetic material 32. This can be accomplished by depositing the hard magnetic particles 34 on the soft magnetic layer SML, via sputter for example, and then the non-magnetic material 32 is deposited onto and between the hard magnetic particles 34, partially filling the voids between the hard magnetic particles 34, leaving a portion of the hard magnetic particles 34 exposed. Alternatively, after the on-magnetic material 32 is deposited onto and between the hard magnetic particles 34, a planarization process can be performed to expose hard magnetic particles 34. Then the electrically conductive layer E1 is deposited onto the granular hard magnetic layer HML and making electrical contact with the hard magnetic particles 34. In many embodiments, electrically conducting layer E1 is in electrical contact with the hard magnetic particles 34 and the hard magnetic particles 34 are in electrical contact with the soft magnetic layer SML, as illustrated.

Figure 8:
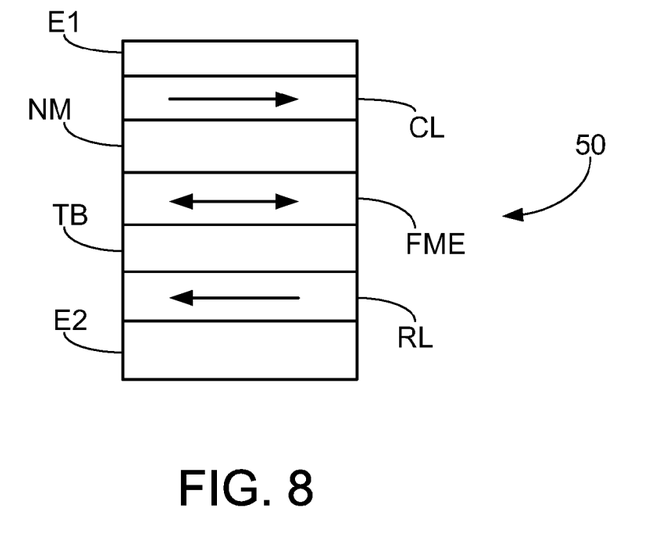
FIG. 8 is a side view schematic diagram of an illustrative spin-transfer torque memory unit with a composite free magnetic element and a compensation layer.
Figure 9:
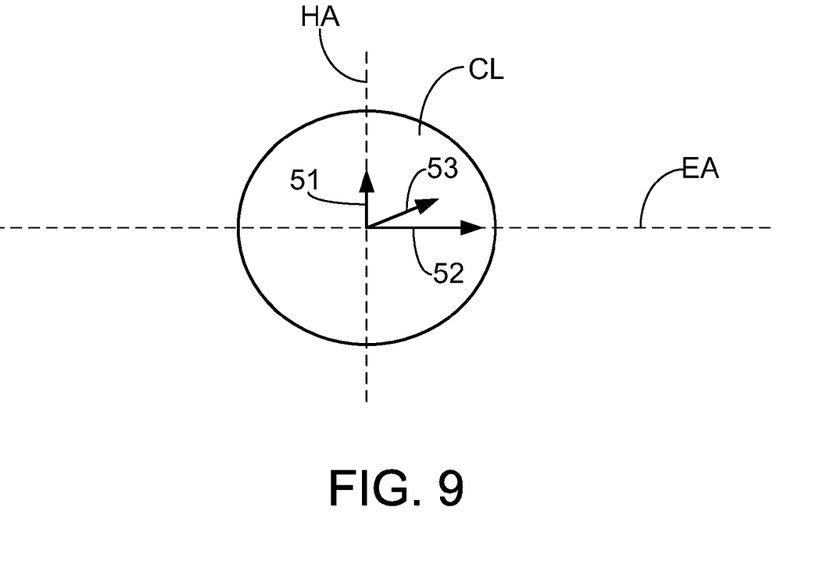
FIG. 9 is a top view schematic diagram of an illustrative compensation layer of FIG. 8.

FIG. 8 is a side view schematic diagram of an illustrative spin-transfer torque memory unit 50 with a composite free magnetic element FME and a compensation layer CL. FIG. 9 is a top view schematic diagram of an illustrative compensation layer CL of FIG. 8. While the composite free magnetic element FME is illustrated as a single layer, it is understood that the composite free magnetic element FME includes hard magnetic layer HML exchanged coupled to a soft magnetic layer SML as described herein. The hard magnetic layer HML and the soft magnetic layer SML, are described above. In some embodiments, the hard magnetic layer HML is a granular layer, as described above.

The composite free magnetic element FME and the spin-transfer torque memory unit 50 can have an aspect ratio (length/width) of approximately 1, as illustrated as a circular shape in FIG. 9. Thus, the composite free magnetic element FME and the spin-transfer torque memory unit 50 described herein can be scaled to a length and a width to 10 nanometers or less and can increase the spin-transfer torque memory 50 density when formed in an array.

The spin-transfer torque memory unit 50 includes a composite free magnetic element FME, a reference magnetic element or layer RL, and an electrically insulating and non-magnetic tunneling barrier layer TB separating the multilayer free magnetic layer FL from the reference magnetic layer RL. The reference magnetic layer RL can be a single ferromagnetic layer, or may include multiple layers, for example, a pair of ferromagnetically coupled ferromagnetic layers, an antiferromagnetic pinning layer and a ferromagnetic pinned layer, a synthetic antiferromagnetic, or a synthetic antiferromagnetic with an antiferromagnetic layer.

The composite free magnetic element FME includes a hard magnetic layer HML exchanged coupled to a soft magnetic layer SML. In many embodiments the hard magnetic layer HML is disposed on the soft magnetic layer SML. The composite free magnetic element FME has a magnetization orientation that can change direction due to spin-torque transfer when a write current passes through the spin-transfer torque memory unit 50 between the first electrode E1 and the second electrode E2.

The spin-transfer torque memory unit 50 further includes a compensation layer CL and a non-magnetic layer NM separating the compensation layer CL from the composite free magnetic element FME. The magnetic compensation layer CL is a ferromagnetic material that can have a hard magnetic property that can be set following deposition of the magnetic compensation layer CL. While the reference magnetic layer RL is illustrated as a single layer, it is understood that the reference magnetic layer RL can be multilayer structure, such as a synthetic antiferromagnetic reference magnetic element, as described above.

The non-magnetic layer NM can be electrically conductive or electrically insulating. An electrically insulating and non-magnetic layer NM can be formed of any useful electrically insulating non-magnetic material such as $Al_2O_3$ or MgO. An electrically conducting and non-magnetic layer NM can be formed of any useful electrically conducting non-magnetic material such as Ru, Os, Ti, Cr, Rh, Cu, Pd, or combinations thereof. This non-magnetic layer NM can have a thickness in a range from 1 to 10 nanometers or from 3 to 7 nanometers.

The magnetic compensation element CL applies a bias field on the magnetization orientation of the composite free magnetic element FME. FIG. 9 is a top view schematic diagram of an illustrative magnetic compensation element CL. The magnetic compensation element CL is illustrated having a circular shape (aspect ratio of approximately 1), however the magnetic compensation element CL can have any useful shape. The composite free magnetic element FME is disposed beneath the magnetic compensation element CL, however the easy axis EA and a perpendicular or orthogonal hard axis HA of the free magnetic layer as illustrated as dashed lines superimposed on the magnetic compensation element CL. In many embodiments the magnetic compensation element CL is patterned onto the spin-torque transfer cell and has a substantially similar shape and size as the spin-torque transfer cell. Deposition of the magnetic compensation element CL does not set the magnetization orientation of the magnetic compensation element CL in any particular direction. Setting the magnetization orientation of the magnetic compensation element CL is accomplished after deposition of the magnetic compensation element CL. Thus, the magnetization orientation of the magnetic compensation element CL can be custom set depending on the desired magnetic effect.

The bias field generated by the magnetic compensation element CL is a result of a magnetic moment vector 53 or magnetization orientation 53 (that is set following deposition of the magnetic compensation element CL) of the magnetic compensation element CL. The magnetic moment vector 53 is the vector sum of a first vector component 52 that is parallel to the free magnetic layer easy axis EA and a second vector component 51 that is orthogonal to the free magnetic layer easy axis (thus parallel to the free magnetic layer hard axis HA).

The first vector component 52 that is parallel to the free magnetic layer easy axis EA can shift a resistance-current hysteresis loop magnetic property of the spin-torque transfer memory unit. A direction of the first vector component 52 determines the direction of the resistance-current hysteresis loop magnetic property shift. The magnitude of the shift can be altered by increasing or decreasing a thickness of the magnetic compensation element CL. The resistance-current hysteresis loop magnetic property of the spin-transfer torque memory unit can be measured and then the direction and amount of first vector component 52 can be set as desired. In many embodiments, the first vector component 52 is set to shift the resistance-current hysteresis loop magnetic property to that the switching field/current is more symmetric than what was measured.

The second vector component 51 that is perpendicular to the free magnetic layer easy axis EA can reduce a write current magnitude required to switch the direction of the magnetization orientation of the free magnetic layer. The write current magnitude required to switch the direction of the magnetization orientation of the free magnetic layer can be measured and then the direction and amount of second vector component 51 can be set as desired. In many embodiments, the second vector component 51 is set to reduce the write current magnitude required to switch the direction of the magnetization orientation of the free magnetic layer. from what was measured.

Thus, embodiments of the STRAM WITH COMPOSITE FREE MAGNETIC ELEMENT are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A spin-transfer torque memory unit, comprising:
a composite free magnetic element comprising a hard magnetic layer exchanged coupled to a soft magnetic layer, the soft magnetic layer having a spin polarization value greater than 0.5, the free magnetic element having a magnetization orientation that is configured to change direction due to spin-torque transfer when a write current passes through the spin-transfer torque memory unit;
a reference magnetic element having a magnetization orientation that is pinned in a reference direction; and
an electrically insulating and non-magnetic tunneling barrier layer separating the composite free magnetic element from the magnetic reference element.

2. A spin-transfer torque memory unit according to claim 1, wherein the hard magnetic layer has uniaxial magnetic anisotropy.

3. A spin-transfer torque memory unit according to claim 1, wherein the hard magnetic layer has a coercively value that is equal to or greater than 1000 Oersteds.

4. A spin-transfer torque memory unit according to claim 1, wherein the composite free magnetic element has an aspect ratio of 1.

5. A spin-transfer torque memory unit according to claim 1, wherein the soft magnetic layer has a coercively value that is equal to or less than 500 Oersteds.

6. A spin-transfer torque memory unit according to claim 1, wherein the hard magnetic layer has a saturation moment of less than 500 emu/cm$^3$.

7. A spin-transfer torque memory unit, comprising:
a composite free magnetic element comprising a hard magnetic layer exchanged coupled to a soft magnetic layer, the hard magnetic layer comprising a plurality of hard magnetic particles separated by non-magnetic material, the composite free magnetic element having a magnetization orientation that is configured to change direction due to spin-torque transfer when a write current passes through the spin-transfer torque memory unit;
a reference magnetic element having a magnetization orientation that is pinned in a reference direction; and
an electrically insulating and non-magnetic tunneling barrier layer separating the composite free magnetic element from the magnetic reference element.

8. A spin-transfer torque memory unit according to claim 7, wherein the soft magnetic layer has a spin polarization value greater than 0.5.

9. A spin-transfer torque memory unit according to claim 7, wherein the hard magnetic particles have uniaxial magnetic anisotropy and a coercively value greater than 1000 Oersteds.

10. A spin-transfer torque memory unit according to claim 7, wherein the free magnetic element has an aspect ratio of 1.

11. A spin-transfer torque memory unit according to claim 7, wherein the soft magnetic layer has a coercivity value less than 500 Oersteds.

12. A spin-transfer torque memory unit according to claim 7, wherein the hard magnetic particles have a saturation moment of less than 500 emu/cm$^3$.

13. A spin-transfer torque memory unit according to claim 7, wherein the non-magnetic material is electrically insulating.

14. A spin-transfer torque memory unit according to claim 13, further comprising an electrically conducting layer in electrical contact with the hard magnetic particles and the hard magnetic particles being in electrical contact with the soft magnetic layer.

15. A spin-transfer torque memory unit, comprising:
a composite free magnetic element comprising a hard magnetic layer exchanged coupled to a soft magnetic layer, the free magnetic element having a magnetization orientation that is configured to change direction due to spin-torque transfer when a write current passes through the spin-transfer torque memory unit;
a reference magnetic element having a magnetization orientation that is pinned in a reference direction;
an electrically insulating and non-magnetic tunneling barrier layer separating the composite free magnetic element from the magnetic reference element; and
a magnetic compensation element adjacent to the free magnetic element, the magnetic compensation element applying a bias field on the magnetization orientation of the free magnetic element, wherein the bias field reduces a write current magnitude required to switch the direction of the magnetization orientation of the free magnetic element.

16. A spin-transfer torque memory unit according to claim 15, further comprising a non-magnetic spacer layer separating the magnetic compensation element from the composite free magnetic element.

17. A spin-transfer torque memory unit according to claim 15, wherein the soft magnetic layer has a spin polarization value greater than 0.5, and the hard magnetic layer has uniaxial magnetic anisotropy and a coercivity value greater than 1000 Oersteds.

18. A spin-transfer torque memory unit according to claim 15, wherein the hard magnetic layer comprising a plurality of hard magnetic particles in a matrix of non-magnetic material.

19. A spin-transfer torque memory unit according to claim 18, wherein the matrix of non-magnetic material is electrically insulating.

* * * * *